United States Patent [19]

Girisch

[11] Patent Number: 5,418,184
[45] Date of Patent: May 23, 1995

[54] METHOD OF MANUFACTURING A SEMICONDUCTOR DEVICE IN WHICH DOPANT ATOMS ARE PROVIDED IN A SEMICONDUCTOR BODY

[75] Inventor: Reinhard B. M. Girisch, Nijmegen, Netherlands

[73] Assignee: U.S. Philips Corporation, New York, N.Y.

[21] Appl. No.: 153,386

[22] Filed: Nov. 16, 1993

[51] Int. Cl.⁶ .................................................. H01L 21/40
[52] U.S. Cl. ................................. 437/135; 437/134; 437/140; 437/141; 437/25
[58] Field of Search ............... 437/135, 134, 140, 141, 437/25, 44, 45, 41; 432/253

[56] References Cited

U.S. PATENT DOCUMENTS

| | | | |
|---|---|---|---|
| 3,556,879 | 1/1971 | Mayer | 148/191 |
| 4,514,440 | 4/1985 | Justice et al. | 437/141 |
| 4,998,879 | 3/1991 | Foster et al. | 432/253 |
| 5,124,272 | 6/1992 | Saito et al. | 437/44 |
| 5,244,831 | 9/1993 | Hindman et al. | 437/141 |

FOREIGN PATENT DOCUMENTS

| | | |
|---|---|---|
| 0160919 | 11/1985 | European Pat. Off. |
| 0492991 | 7/1992 | European Pat. Off. |

*Primary Examiner*—Brian E. Hearn
*Assistant Examiner*—Kevin M. Picardat
*Attorney, Agent, or Firm*—Steven R. Biren

[57] ABSTRACT

A method of manufacturing a semiconductor device includes the step of providing a dopant (4) near a surface (2) of a semiconductor body (1) in a deposition step, after which in a diffusion step the dopant (4) is diffused into the semiconductor body (1) by keeping the semiconductor body (1) at an elevated temperature for a certain period in a furnace (11) while a process gas (13) is being passed through the furnace (11), after which any oxide layer (8) formed on the surface (2) is removed. A small amount of a hydrogen halide is added to the process gas (13), and it has been found that the creation of lattice dislocations in semiconductor devices is reduced thereby because impurities which play a part in the creation of lattice dislocations react with the hydrogen halide and are removed.

5 Claims, 2 Drawing Sheets

METHOD OF MANUFACTURING A SEMICONDUCTOR DEVICE IN WHICH DOPANT ATOMS ARE PROVIDED IN A SEMICONDUCTOR BODY

BACKGROUND OF THE INVENTION

The invention relates to a method of manufacturing a semiconductor device whereby a dopant is provided near a surface of a semiconductor body in a deposition step, after which in a diffusion step said dopant is diffused into the semiconductor body in that the semiconductor body is kept at an elevated temperature for a certain period in a furnace while a process gas is passed through the furnace, after which any oxide layer formed on the surface is removed.

The semiconductor body may be provided with regions of a certain conductivity type by means of the method through deposition and diffusion of a dopant of this conductivity type. Dopant atoms are provided near the surface of the semiconductor body in the deposition step, in general in a region less than 0.5 $\mu$m removed from the surface, for example, through implantation or a shallow diffusion, for example, from a process gas or from a doped glass layer. In the diffusion step ("drive-in"), the atoms are subsequently brought to a greater depth below the semiconductor body surface through diffusion and activated through a heat treatment for several hours at a temperature above approximately 1100° C. Process gases used may be, for example, argon, oxygen, nitrogen, or a combination of these gases. After the diffusion step, any oxide layer which has formed on the surface during the deposition or diffusion step is removed, for example, to provide a possibility of manufacturing further regions in the region made by the method or for providing the region manufactured with an electrical connection. The method may be used for providing a semiconductor body with regions of a certain conductivity type. These regions may be used, for example, in diodes, transistors and ICs, for example, as pn junctions, resistors, insulation diffusions, contact zones, and channel stoppers.

European Patent 1609 19 discloses a method of the kind mentioned in the opening paragraph whereby boron is implanted into a silicon semiconductor body with an energy of between 20 and 200 keV and a concentration of between 5 and $15 \times 10^{14}$ atoms/cm$^2$. The implanted boron atoms are then diffused into the semiconductor body in the diffusion step at a temperature of between 1150° C. and 1250° C. for 30 to 300 minutes in a process gas containing a small proportion of oxygen.

It is found in practice that a number of problems arise in semiconductor devices manufactured by the known method. When the known method is used for manufacturing a zener diode, it is found that the diode has a breakdown characteristic, i.e. a transition between conduction and non-conduction of current as a function of the voltage across the diode, which is so gradual that the zener voltage is not well defined and the diode is, for example, useless as a switch in an electric circuit. Furthermore, the known method is found to be not very reliable. Thus properties such as electrical resistance and breakdown voltage of semiconductor devices made by the known method may vary strongly.

SUMMARY OF THE INVENTION

The invention has for its object inter alia to manufacture semiconductor devices in which the said problems are avoided at least partly.

According to the invention, the method is for this purpose characterized in that a hydrogen halide is added to the process gas in small quantities.

It was a surprise to find that the transition between conduction and non-conduction of current as a function of the voltage across a diode manufactured by the method according to the invention is sharper than in a diode manufactured by the known method. The current-voltage characteristic is very steep. Moreover, the reliability of semiconductor devices made by the method according to the invention has increased.

The invention is based on the recognition that the comparatively poor properties of semiconductor devices manufactured by the known method are the result of lattice imperfections in the semiconductor body. For example, breakdown of a pn junction can occur comparatively easily at the area of lattice imperfections. Breakdown of the pn junction will then take place at lattice imperfections and at the pn junction itself at different voltages across the junction. The transition between conduction and non-conduction of current in pn junctions of semiconductor devices made by the known method, accordingly, will take place over a comparatively wide voltage range. The lattice imperfections in the semiconductor device may be caused by high mechanical stresses, for example, at pn junctions, or by scratches or slip lines, for example, at the surface of the semiconductor body. The invention is also based on the recognition that the threshold for the creation of these lattice imperfections is lowered by the presence of metal impurities. Especially during the diffusion step ("drive-in") of dopant atoms, which takes place during a comparatively long period at a comparatively high temperature, impurities such as Fe, Ni and Cu are deposited on the surface of the semiconductor body, after which the impurities diffuse into the semiconductor body. The impurities are probably generated by the furnace system. When a pn junction is manufactured by the known method, many impurities will concentrate close to the pn junction because of mechanical stresses between p- and n-type material and will introduce comparatively many lattice imperfections there. The number of impurities is dependent on the furnace temperature, duration of the heat treatment of the semiconductor bodies in the furnace, and the cleanness of the furnace. Owing to the measure according to the invention, the impurities react with the hydrogen halide during the dopant diffusion step, whereby volatile compounds are formed which are subsequently removed along with the process gas.

It is noted that it is known to clean a diffusion furnace periodically, for example, once a month with a process gas such as argon and oxygen to which approximately 2 to 3% by volume HCl is added at a temperature of approximately 1150° C. Impurities are removed from a wall of the diffusion furnace during the cleaning process. This, however, is not sufficient for avoiding the problems described above.

It is further noted that it is known from U.S. Pat. No. 3,556,879 to add a hydrogen halide to a steam-nitrogen process gas during growing of an insulating layer on a polluted semiconductor body. Impurities which diffuse from the semiconductor body into the insulating layer are thus removed from the insulating layer. In the method according to the invention, the impurity originates from surroundings of the semiconductor body, which itself is clean. In the known method, furthermore, an insulating layer is manufactured which is used, for example, as a field oxide, i.e. as an insulation between two semiconductor regions. In other words, a functional oxide is manufactured. In the method according to the invention, an insulating layer may also be formed during the diffusion step. This layer, however, is subsequently removed and accordingly is not a functional insulating layer. Pollution and quality of the insulating layer, therefore, are not relevant to the method according to the invention.

Preferably, a process gas is used comprising less than 15% by volume of oxygen. An oxide layer of small thickness is then formed on the surface of the semiconductor body. The thickness of the oxide layer is so small that the formed oxide layer cannot be used as a passivating, insulating, or masking layer. The oxide layer protects the silicon surface against attacks by the hydrogen halide. For example, when a process gas comprising 90% $N_2$ and 10% $O_2$ is used, an approximately 200 nm thick oxide layer is created during a heat treatment of 16 hours at 1200° C. The oxide layer formed during the diffusion step can be readily removed because of its small thickness.

Although various halogens such as iodine, bromine or chlorine may be used in the hydrogen halide, the method according to the invention is preferably characterized in that chlorine is used as the halogen in the hydrogen halide. Chlorine is readily available in semiconductor processes, for example, in the form of hydrogen chloride or trichloroethane (TCA).

It is found in practice that problems may occur involving attacks on the semiconductor body when more than approximately 1% by volume of hydrogen chloride is added to the process gas. Furthermore, it is surprisingly found that a comparatively low concentration of the hydrogen halide is sufficient for making semiconductor devices with good properties. Preferably, therefore, the method according to the invention is characterized in that chlorine is added to the process gas in a concentration of more than 0.1 and less than 0.9% by volume.

An additional advantage is obtained when the method according to the invention is characterized in that a furnace system is used which is provided with silicon carbide components. Such components may be, for example, furnace pipes, wafer supports, and so-called paddles which are used for introducing the wafer support with wafers into the furnace. In practice, furnaces with furnace pipes made of quartz or silicon carbide are used as furnaces for diffusion processes. Silicon carbide has a greater mechanical strength than quartz at higher temperatures. Silicon carbide furnace pipes, therefore, are generally used for diffusion processes at higher temperatures, above approximately 1100° C., for example, for reducing the duration of the diffusion at a higher temperature. A disadvantage is, however, that semiconductor devices manufactured by the known method in a furnace provided with a silicon carbide furnace pipe give more problems as mentioned above than do semiconductor devices manufactured in a furnace provided with a quartz furnace pipe. It is found that silicon carbide furnace pipes in general generate more impurities than do quartz furnace pipes. Owing to the method according to the invention, good semiconductor devices can be manufactured also with a silicon carbide furnace pipe containing comparatively many impurities, while diffusions can take place at a higher temperature than with a quartz furnace pipe.

Preferably, the method according to the invention is characterized in that the furnace is kept at a temperature above 1100° C. The diffusion can be carried out comparatively quickly at such a high temperature. An additional advantage is obtained when the method is characterized in that the semiconductor body is placed in the furnace for more than two hours. The diffusion may then be carried out to a greater depth in the semiconductor body. It is found in practice that the properties of semiconductor bodies referred to above are not good when diffusions are carried out by the known method at a temperature above 1100° C. or during a time longer than 120 minutes. A comparatively strong pollution of the semiconductor body is found to take place at such a high temperature and at such long durations because more impurities become available, for example, owing to diffusion through the furnace pipe. With the method according to the invention, the pollution is substantially prevented, so that the diffusion can be carried out nevertheless at a comparatively high temperature or during a long period.

BRIEF DESCRIPTION OF THE DRAWING

The invention will be explained in more detail below, by way of example, with reference to an embodiment as shown in the accompanying diagrammatic drawing, in which.

The Figures are purely diagrammatic and not drawn to scale. Corresponding parts are generally given the same reference numerals in the Figures.

DESCRIPTION OF THE PREFERRED EMBODIMENTS

Figure 1:
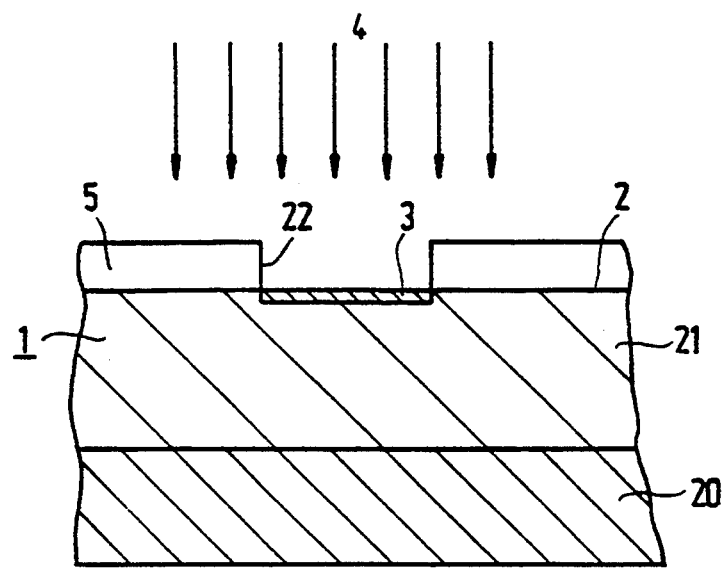
FIG. 1 shows a deposition step in which dopant atoms are deposited near a surface of a semiconductor body.
Figure 2:
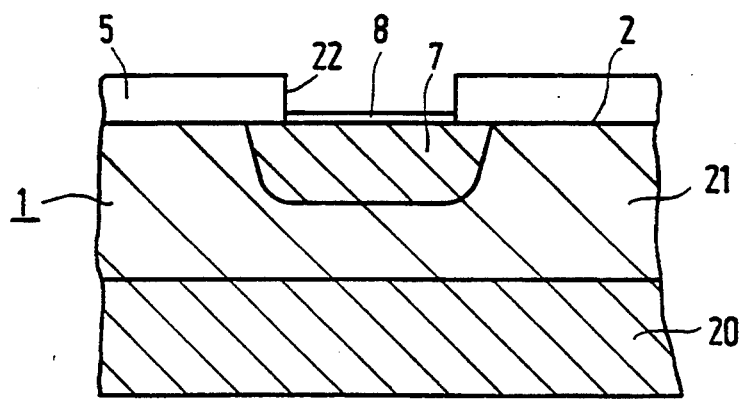
FIG. 2 shows a diffusion step in which dopant atoms are diffused into a semiconductor body.

FIGS. 1 and 2 show stages in the manufacture of a semiconductor device, whereby in a deposition step (FIG. 1) a dopant 4 is provided near a surface 2 of a semiconductor body 1, after which in a diffusion step (FIG. 2) the dopant is diffused into the semiconductor body 1 in that the semiconductor body 1 is kept at an elevated temperature for a certain time in a furnace, while a process gas is being passed through the furnace, after which any oxide layer 8 formed on the surface is removed.

Figure 3:
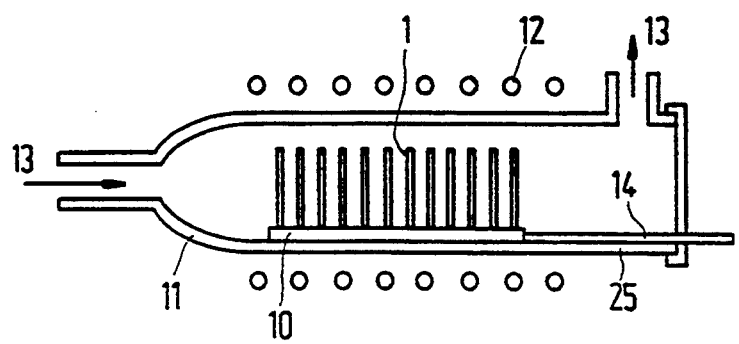
FIG. 3 shows a diffusion furnace system provided with semiconductor bodies for carrying out the diffusion step.

By means of the method, the semiconductor body 1 may be provided with regions 7 of a certain conductivity type through deposition and diffusion of atoms of a dopant 4 associated with that conductivity type, for example, B, P, As. The dopant atoms are provided in a region 3 near the surface 2 of the semiconductor body 1 in the deposition step, generally in a region 3 at a distance of less than 0.5 μm from the surface 2. Deposition may take place, for example, through implantation or through a shallow diffusion, for example, from a process gas comprising, for example, $PH_3$ or $B_2H_4$, or from a doped glass layer, for example phosphorus glass, or from a doped polysilicon layer. The deposited dopant atoms may be present below the surface 2, for example, after implantation or shallow diffusion, or alternatively above the surface 2, for example, in a glass or polysilicon layer. In the diffusion step ("drive-in"), the dopant atoms are then brought to a comparatively great depth below the surface of the semiconductor body through diffusion and are activated. The diffusion step is carried out by means of a heat treatment at a temperature above approximately 1100° C. for a few hours. FIG. 3 shows how in practice one or several semiconductor bodies 1 are put on a support 10 for this purpose, which support is passed into the furnace 11 by means of a paddle, upon which the bodies I are kept at a temperature of between 1100° and 1250° C. through heating by means of a heat source 12. The heat treatment usually lasts several hours, for example, approximately 15 hours. A process gas 13 is passed through the furnace 11 during the heat treatment. Process gases which may be used are, for example, argon, oxygen, nitrogen, or a combination of these gases. Any oxide layer 8 formed on the surface is removed after the diffusion step. Such an oxide layer 8 may arise during the deposition and/or diffusion step. The oxide layer 8 is removed for providing a possibility, for example, of making further regions 15 in the region 7 made by means of the method (see FIG. 4). It is also possible for the manufactured region 7 to be provided with an electrical connection after removal of the oxide layer 8. By means of the method, for example, a semiconductor body 1 of a certain conductivity type may be provided with regions of an opposite conductivity type, or a region manufactured by means of the method may be provided, in a further process step, with dopant atoms of a conductivity type opposite to that of the atoms of the deposition and the diffusion step. The regions of a certain conductivity type may be used in, for example, diodes, transistors and ICs, for example as pn junctions, resistors, insulation diffusions, contact zones, and channel stoppers.

Figure 4:
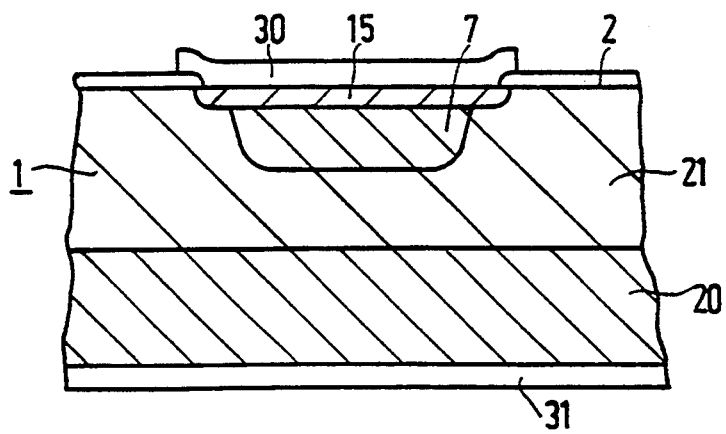
FIG. 4 is a cross-section of a zener diode.
Figure 5:
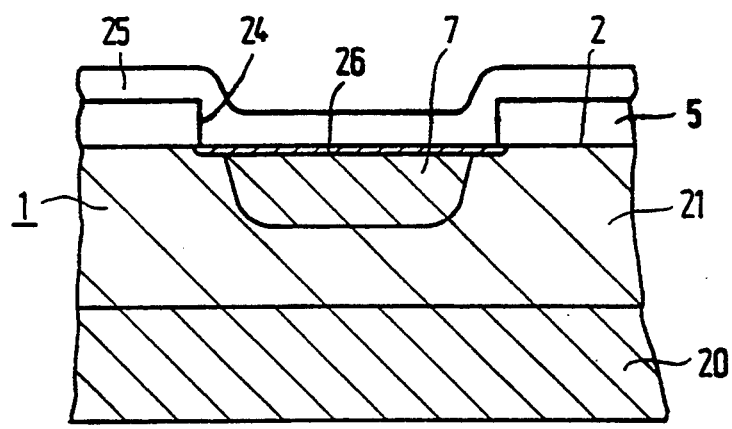
FIGS. 5, 6 show two stages in the manufacture of the zener diode of FIG. 4.
Figure 6:
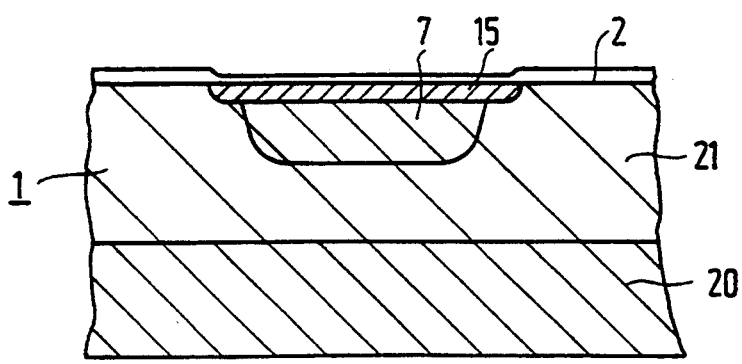

As an example of an embodiment, a zener diode as shown in FIG. 4 may thus be manufactured in that an oxide layer 5 is provided on a semiconductor body 1 having a highly doped n-type (n+) substrate 20 and having a more weakly doped n-type (n−) epitaxial layer 21, in which oxide layer subsequently a window 22 is etched (see FIG. 1). $1 \times 10^{15}$ P atoms/cm$^2$ 4 are provided through this window 22 in a region 3 near the surface 2 of the semiconductor body 1 in a deposition step. The semiconductor body 1 is then placed on a support 10 in a furnace 11, after which a heat treatment at 1200° C. is carried out for 16 hours while a process gas is being passed through the furnace (see FIG. 3). The P atoms are thus diffused into the semiconductor body 1. A thin oxide layer 8 is created on the surface 2 during the diffusion step (see FIG. 2). This oxide layer 8 is removed in a subsequent process step and a window 24 is made in the oxide layer 5 (see FIG. 5). Then a layer of borosilicate glass 25 is provided in usual manner. While the glass layer 25 is being provided, B is deposited near the surface 2 and a region 26 is formed with a conductivity type opposite to that of region 7. The borosilicate glass layer 25 and a portion of the oxide layer 5 are subsequently removed and B is diffused further into the semiconductor body 1 from region 26 in a diffusion step at 1100° C., whereby region 15 is formed (see FIG. 6). The duration of the B diffusion depends on the desired zener voltage of the zener diode, as is normal in the manufacture of a zener diode, for example, a duration of approximately 1 hour for a zener voltage of 12 V. The zener diode of FIG. 6 is provided with contact layers 30 and 31 in usual manner for connecting the electrodes of the zener diode (see FIG. 4).

Figure 7:
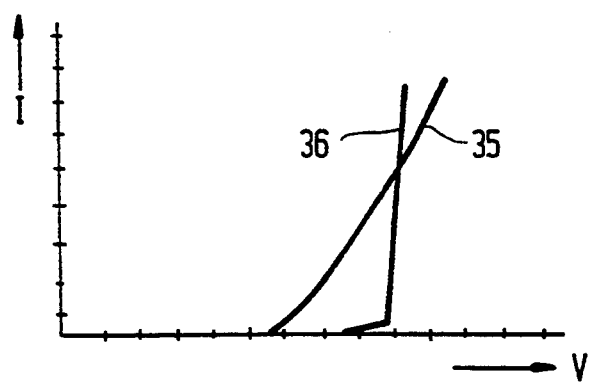
FIG. 7 shows current-voltage characteristics of a zener diode of FIG. 4 manufactured by the known method and of a zener diode of FIG. 4 manufactured by the method according to the invention.

It is found in practice that a number of problems arise in semiconductor devices made by the known method. Curve 35 in FIG. 7 shows a current-voltage (I-V) curve of a zener diode made by a known method. The slope of curve 35 in FIG. 7 shows that the differential electrical resistance of the zener diode is comparatively high when the zener diode conducts current. It is also apparent from FIG. 7, curve 35, that the zener diode has a breakdown characteristic, i.e. a transition from conduction and non-conduction of current as a function of the voltage across the diode, which is so gradual that the zener voltage is not well defined. The known method is furthermore found to be not very reliable. Thus the properties mentioned above of semiconductor devices made by the known method may vary strongly.

According to the invention, a hydrogen halide is added to the process gas in the diffusion step. Curve 36 in FIG. 7 shows that a zener diode made by the method according to the invention shows a transition between conduction and non-conduction of current as a function of the voltage across a zener diode which is much sharper than the transition in a diode made by the known method (curve 35). The differential resistance of the diode of curve 36, moreover, is much lower. Furthermore, the reliability of semiconductor devices made by the method according to the invention has increased. The invention is based on the recognition that impurities from the furnace system influence the creation of lattice imperfections in semiconductor bodies. The lattice imperfections may form generation-recombination centers for charge carders and thus influence, for example, the electrical resistance of the semiconductor body material. It is also possible that breakdown of a pn junction takes place both on the lattice imperfections and on the pn junction itself at different voltages across the junction. The transition between conduction and non-conduction of current in pn junctions of semiconductor bodies made by the known method, therefore, will cover a comparatively wide voltage range (see curve 35 in FIG. 7). The lattice imperfections in the semiconductor device may be caused by high mechanical stresses, for example on pn junctions, because p- and n-materials have different lattice constants. Lattice imperfections may also arise from mechanical disturbances of the lattice, for example, at the surface of the semiconductor body owing to scratches or slip lines. The invention is further based on the recognition that the lattice imperfections are also caused to a considerable degree by impurities in the semiconductor body. Especially during the diffusion step ("drive-in") of dopant atoms, which takes place for a comparatively long time at a comparatively high temperature, impurities such as Fe, Ni, Cu and alkali atoms are deposited on the surface of the semiconductor body, after which these impurities diffuse into the semiconductor body. The impurities probably originate from the furnace 11 (see FIG. 3). A diffusion furnace in practice comprises a furnace pipe 25. Impurities probably originate from this furnace pipe 25, the heat source 12, the support 10 or the paddle 14. Usually, the diffusion furnace is periodically cleaned, for example once a month with a process gas such as argon and oxygen to which approximately 2 to 3% by volume HCl has been added at a temperature of approximately 1150° C. This, however, is not sufficient to avoid pollution of the semiconductor body. The impurities play a part in the creation of lattice imperfections, so-called misfit dislocations, in the crystal lattice of the semiconductor body. The number of impurities may vary strongly in the known method. When a pn junction is made by the known method, many impurities will concentrate near the very pn junction owing to mechanical stresses between p- and n-type material, and introduce comparatively many lattice imperfections there. The number of impurities also depends on the furnace temperature, the duration of the heat treatment of the semiconductor bodies in the furnace, and the cleanness of the furnace. Owing to the measure according to the invention, the impurities react with the hydrogen halide during the dopant diffusion step and form volatile compounds, which are subsequently removed along with the process gas. The impurities then can no longer be deposited on the semiconductor body and pollute the latter.

Preferably, a process gas is used with less than 50% by volume oxygen. An oxide layer of small thickness is then formed on the surface of the semiconductor body. The oxide layer thickness is so small that the formed oxide layer cannot be used as a passivating, insulating or masking layer. In the embodiment mentioned above, where a zener diode was manufactured, a process gas containing 90% $N_2$ and 10% $O_2$ was used. An approximately 200 nm thick oxide layer 8 then arises during a heat treatment for 16 hours at 1200° C. The oxide layer 8 formed during the diffusion step can be readily removed because of its small thickness.

Although several halogens such as iodine, bromine or chlorine may be used for the hydrogen halide, chlorine is preferably used as the halogen in the hydrogen halide. Chlorine is readily available in semiconductor processes, for example in the form of hydrogen chloride or trichloroethane (TCA).

It is found in practice that the addition of more than approximately 1% by volume of hydrogen halide to the process gas may lead to problems involving attacking of the semiconductor body 1. The surface 2 of the semiconductor body then becomes comparatively rough. The windows 22 and 24 are also attacked by underetching. It is surprisingly found that a comparatively low concentration of the hydrogen halide is sufficient for manufacturing semiconductor devices with good properties. Impurities are accumulated during a comparatively long period at high temperatures in a diffusion step. The quantity of impurities deposited per unit time on the surface 2 is comparatively small, so that this quantity can already be neutralized with a comparatively low hydrogen halide concentration. Preferably, therefore, chlorine is added to the process gas in a concentration of more than 0.1 and less than 0.9% by volume in the method according to the invention. Thus 0.2% TCA by volume is added to the process gas in the manufacture of the zener diode according to the embodiment, which corresponds to a chlorine concentration of 0.6% by volume.

An additional advantage is obtained when a furnace system 11 provided with silicon carbide components is used in the method according to the invention. Such components may be, for example, a furnace pipe 25, a wafer support 10 and a paddle 14 (see FIG. 3). Furnaces for diffusion processes used in practice are furnaces 11 with furnace pipes 25 made of quartz or silicon carbide. Silicon carbide has a greater mechanical strength than quartz at higher temperatures. Thus quartz furnace pipes used at temperatures above 1100° C. may sag owing to their great length. Especially when semiconductor bodies 1 with comparatively large dimensions are used, the sagging furnace pipe 25 and the semiconductor bodies 1 may touch one another, so that the semiconductor bodies are damaged. Silicon carbide furnace pipes, therefore, are generally used for diffusion processes at higher temperatures, above approximately 1100° C., for example in order to reduce the duration of the diffusion at a higher temperature. A disadvantage, however, is that semiconductor devices made by the known method in a furnace provided with a silicon carbide furnace pipe 25 give rise to more problems as defined above than do semiconductor devices made in a furnace provided with a quartz furnace pipe. It is found that silicon carbide furnace pipes in general give off more pollutants than do quartz furnace pipes. Thanks to the measure according to the invention, good semiconductor devices can be made also with a silicon carbide furnace pipe with comparatively many pollutants, in which diffusions can take place at a higher temperature than in a quartz furnace pipe.

Preferably, the furnace 11 is kept at a temperature above 1100° C. in the method according to the invention. The diffusion may be carried out comparatively quickly at such a high temperature. An additional advantage is obtained when the semiconductor body is placed in the furnace for more than two hours. The diffusion can then be carried out to a greater depth in the semiconductor body. It is found in practice that the properties of the semiconductor devices are not good when diffusion steps are carried out in the known method at a temperature above 1100° C. or for a time longer than 2 hours. A comparatively strong pollution of the semiconductor body is found to take place at such a high temperature and with such long times. A small quantity of impurities originating from the furnace pipe 25 or, for example, from the heat source 12 arrives per unit time at the semiconductor body. Problems arise with semiconductor devices manufactured in this way owing to accumulation of these impurities. Owing to the measure according to the invention, the pollution is substantially prevented, so that the diffusion can nevertheless be carried out at a comparatively high temperature or for a longer period.

The invention is not limited to the embodiment described above, but is also applicable to analogous cases in which a region in a semiconductor body is provided with dopant atoms by a deposition step and a diffusion step. The method according to the invention is suitable for manufacturing pn junctions, resistors, insulation diffusions, contact zones, channel stoppers, etc.

I claim:

1. A method of manufacturing a semiconductor device in which a dopant is provided near a surface of a semiconductor body in a deposition step, after which in a diffusion step said dopant is diffused into the semiconductor body by keeping the semiconductor body at an elevated temperature for a selected period in a furnace while a process gas is passed through the furnace, after which any oxide layer formed on the surface is removed, wherein a hydrogen halide is added to the process gas, said hydrogen halide comprising chlorine in a concentration of more than 0.1% and less than 0.9% by volume.

2. A method as claimed in claim 1, characterized in that a process gas is used comprising less than 15% by volume of oxygen.

3. A method as claimed in claim 1, characterized in that a furnace system is used which is provided with silicon carbide components.

4. A method as claimed in claim 1, characterized in that the furnace is kept at a temperature above 1100° C.

5. A method as claimed in claim 1, characterized in that the semiconductor body is placed in the furnace for more than two hours.

* * * * *